United States Patent
Das et al.

(10) Patent No.: US 9,026,406 B2
(45) Date of Patent: May 5, 2015

(54) METHOD, APPARATUS AND COMPUTER PROGRAM PRODUCT FOR DETERMINING THE STRAIN INDUCED AT A SELECTED POINT IN A STIFFENED PANEL STRUCTURE IN RESPONSE TO A LOAD, TAKING INTO ACCOUNT ONE OR MORE OUT OF PLANE (OOP) EFFECTS

(75) Inventors: Shumit Das, Sutton (GB);
Jean-Philippe Navarro, Plaisance-du-Touch (FR); Jose Carrasco-Fernandez, Madrid (ES)

(73) Assignees: Airbus Operations Limited, Bristol (GB); Airbus Operations SAS, Toulouse (FR); Airbus Operations SL, Madrid (ES)

(*) Notice: Subject to any disclaimer, the term of this patent is extended or adjusted under 35 U.S.C. 154(b) by 379 days.

(21) Appl. No.: 13/479,520

(22) Filed: May 24, 2012

(65) Prior Publication Data
US 2013/0160295 A1    Jun. 27, 2013

(30) Foreign Application Priority Data

May 24, 2011    (GB) .................................. 1108692.3

(51) Int. Cl.
| | |
|---|---|
| G06F 17/50 | (2006.01) |
| G01L 1/00 | (2006.01) |
| B23P 17/00 | (2006.01) |
| G06F 17/00 | (2006.01) |
| G01M 5/00 | (2006.01) |

(52) U.S. Cl.
CPC . G01L 1/00 (2013.01); B23P 17/00 (2013.01); G06F 17/00 (2013.01); G01M 5/0041 (2013.01); G06F 17/5018 (2013.01)

(58) Field of Classification Search
CPC .................................................... G06F 17/5018
USPC .............................................................. 703/1
See application file for complete search history.

(56) References Cited

U.S. PATENT DOCUMENTS

| | | | |
|---|---|---|---|
| 2004/0065152 A1* | 4/2004 | Hull | ............................... 73/579 |
| 2004/0245231 A1 | 12/2004 | Dull et al. | |
| 2006/0089823 A1 | 4/2006 | Meyer et al. | |
| 2008/0103740 A1 | 5/2008 | Meizoso Latova et al. | |
| 2008/0164372 A1 | 7/2008 | Gallet et al. | |

OTHER PUBLICATIONS

P. Buermann et al., "A semi-analytical model for local post-buckling analysis of stringer- and frame-stiffened cylindrical panels", Thin Walled Structures 44, pp. 102-114 (2006).
British Search Report for GB1108692.3, dated Sep. 13, 2011.

* cited by examiner

*Primary Examiner* — Dwin M Craig
(74) *Attorney, Agent, or Firm* — Lowe Hauptman & Ham, LLP

(57) ABSTRACT

A method, apparatus and computer program product is disclosed for determining the strain induced at a selected point in a stiffened panel structure in response to a load, taking into account one or more out of plane (OOP) effects.

33 Claims, 14 Drawing Sheets

METHOD, APPARATUS AND COMPUTER PROGRAM PRODUCT FOR DETERMINING THE STRAIN INDUCED AT A SELECTED POINT IN A STIFFENED PANEL STRUCTURE IN RESPONSE TO A LOAD, TAKING INTO ACCOUNT ONE OR MORE OUT OF PLANE (OOP) EFFECTS

RELATED APPLICATIONS

The present application is based on, and claims priority from, British Application Number 1108692.3, filed May 24, 2011, the disclosure of which is hereby incorporated by reference herein in its entirety.

FIELD OF INVENTION

The present invention relates to a method, apparatus and computer program product for determining the strain induced at a selected point in a stiffened panel structure in response to a load, taking into account one or more out of plane (OOP) effects.

BACKGROUND OF THE INVENTION

Computer systems are provided for modeling complex structures and for analyzing their performance under a predetermined set of load cases. Such systems are arranged to enable the structure to be designed so that it performs as required during its operation or deployment. Elements of the structure are generally modeled and analyzed under the assumption that their behavior is purely in-plane. For example, given a stiffened panel comprising a panel element and one or more stiffener elements, the analysis would model the panel as carrying only membrane fluxes, that is, biaxial traction-compression and shear loads, while the stiffener elements generally carry only traction-compression forces.

However, some real-world factors are not accounted for in such methods of structural modeling. This could cause a problem if such real-world factors have a critical effect on the performance of the structure. For example, the real structure could fail at lower loads than the modeled structure. Furthermore, the failure may be unpredictable. One solution that is provided to account for such real-world factors, is to build additional tolerance into the structure to enable it to cope with the assumed real-world factors.

SUMMARY OF THE INVENTION

An embodiment of the invention provides a method for determining the strain induced at a selected point in a stiffened panel structure in response to a load, taking into account one or more out of plane (OOP) effects, the method comprising the steps of:

defining a model of a stiffened panel structure;
determining an analysis point in the stiffened panel structure;
selecting an input load for the stiffened panel;
inputting data defining an out of plane (OOP) effect;
modeling a plurality of the stiffened panel structures as a continuous beam and calculating the boundary conditions of a selected one of the stiffened panel structures within the continuous beam model in response to the input load and taking into account the OOP effect;
modeling a single stiffened panel structure as local beam model; and
calculating the strain at the analysis point in the local beam model taking into account the boundary conditions calculated from the continuous beam model and further taking into account the OOP effect.

The method may comprise the further steps of:
determining data representing a strain allowable for the analysis point;
comparing the calculated strain to the strain allowable; and
outputting data representing whether or not the calculated strain meets the strain allowable within a predetermined tolerance.

The method may comprise the further steps of:
if the calculated strain does not meet the strain allowable within the predetermined tolerance then modifying the geometry of the stiffened panel accordingly; and
recalculating the strain at the analysis point.

The strain allowable may be determined in dependence on the geometry of the stiffened panel structure. The strain allowable may be recalculated for the selected analysis point in response to the modifying of the geometry of the stiffened panel structure. The method may comprise the further steps of:
determining the load at which the calculated strain meets the strain allowable within the predetermined tolerance; and
calculating the reserve factor (RF) in respect of the analysis point as the ratio of the determined load to the input load.

The stiffened panel structure may comprise a panel element and a stiffener element and the modifying step comprises modifying a dimension of the panel element. The strain allowable may be defined in relation to respective performance criterion. The continuous beam boundary conditions may comprise the boundary loads, moments and rotations for the selected stiffened panel structure within the continuous beam model. The strain may be calculated from the internal pressures, loads and moments within the local beam model comprising the local beam model. The OOP effect may comprise an effect that deflects the stiffened panel structure its designed plane. The OOP effect may be modeled as a predetermined displacement of the stiffened panel structure from its designed plane. A plurality of OOP effects may be taken into account in calculating the strain. The direction in which the OOP effect acts on the stiffened panel structure may be indeterminate and the calculation of the strain performed for each directions. The calculation of the strain may be performed for the selected one of the stiffened panel structures within the continuous beam model and repeated an adjacent stiffened panel structure in the continuous beam model. Where a plurality of calculations are performed, the calculation exhibiting the highest strain may be selected as the solution. The stiffened panel structure may comprise a panel element in the form of a wing cover panel for and aircraft wing and a stiffener element in the form of a stringer for an aircraft wing.

Another embodiment provides apparatus for determining the strain induced at a selected point in a stiffened panel structure in response to a load, taking into account one or more out of plane (OOP) effects, the apparatus being operable to:
define a model of a stiffened panel structure;
determine an analysis point in the stiffened panel structure;
select an input load for the stiffened panel;
input data defining an out of plane (OOP) effect;
model a plurality of the stiffened panel structures as a continuous beam and calculate the boundary conditions of a selected one of the stiffened panel structures within the continuous beam model in response to the input load and taking into account the OOP effect;

model a single stiffened panel structure as local beam model; and calculate the strain at the analysis point in the local beam model taking into account the boundary conditions calculated from the continuous beam model and further taking into account the OOP effect.

A further embodiment provides a group of one or more programs arranged to enable a group of one or more programmable devices to perform a method for determining the strain induced at a selected point in a stiffened panel structure in response to a load, taking into account one or more out of plane (OOP) effects, the method comprising the steps of:

defining a model of a stiffened panel structure;
determining an analysis point in the stiffened panel structure;
selecting an input load for the stiffened panel;
inputting data defining an out of plane (OOP) effect;
modeling a plurality of the stiffened panel structures as a continuous beam and calculating the boundary conditions of a selected one of the stiffened panel structures within the continuous beam model in response to the input load and taking into account the OOP effect;
modeling a single stiffened panel structure as local beam model; and
calculating the strain at the analysis point in the local beam model taking into account the boundary conditions calculated from the continuous beam model and further taking into account the OOP effect.

Another embodiment provides a group of one or more programs arranged to enable a group of one or more programmable devices to provide apparatus for determining the strain induced at a selected point in a stiffened panel structure in response to a load, taking into account one or more out of plane (OOP) effects, the apparatus being operable to:

define a model of a stiffened panel structure;
determine an analysis point in the stiffened panel structure;
select an input load for the stiffened panel;
input data defining an out of plane (OOP) effect;
model a plurality of the stiffened panel structures as a continuous beam and calculate the boundary conditions of a selected one of the stiffened panel structures within the continuous beam model in response to the input load and taking into account the OOP effect;
model a single stiffened panel structure as local beam model; and
calculate the strain at the analysis point in the local beam model taking into account the boundary conditions calculated from the continuous beam model and further taking into account the OOP effect.

A further embodiment provides a computer program stored on a computer readable medium and loadable into the internal memory of a computer, comprising software code portions arranged, when the program is run on a computer, for performing a method for determining the strain induced at a selected point in a stiffened panel structure in response to a load, taking into account one or more out of plane (OOP) effects, the method comprising the steps of:

defining a model of a stiffened panel structure;
determining an analysis point in the stiffened panel structure;
selecting an input load for the stiffened panel;
inputting data defining an out of plane (OOP) effect;
modeling a plurality of the stiffened panel structures as a continuous beam and calculating the boundary conditions of a selected one of the stiffened panel structures within the continuous beam model in response to the input load and taking into account the OOP effect;
modeling a single stiffened panel structure as local beam model; and
calculating the strain at the analysis point in the local beam model taking into account the boundary conditions calculated from the continuous beam model and further taking into account the OOP effect.

BRIEF DESCRIPTION OF THE DRAWINGS

Embodiments of the invention will now be described, by way of example only, with reference to the accompanying drawings in which.

DETAILED DESCRIPTION OF EMBODIMENTS OF THE INVENTION

Figure 1:
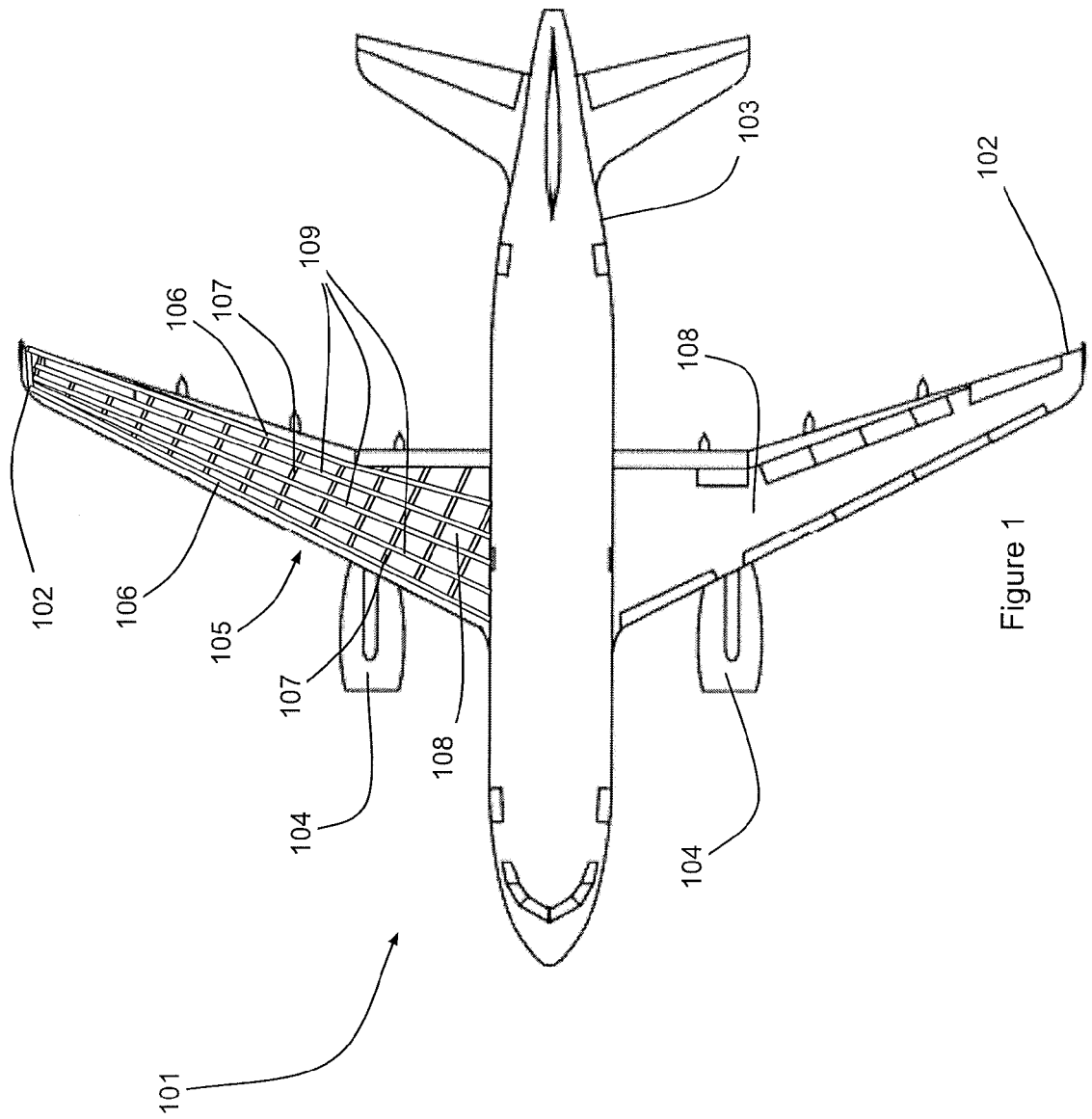
FIG. 1 is a plan view of an aircraft comprising a plurality of wing boxes.

With reference to FIG. 1, an aircraft 101 comprises a pair of wings 102 each fared into a fuselage 103 and each carrying an engine 104. Each wing 102 has a wing box 105 at its core that provides main structure of the wing and provides the attachment point of the wing to the fuselage. The engines 104 and the remaining wing elements such as the leading and trailing edge structures are all attached to the wing box 105. Each wing box 105 comprises a set of spars 106, ribs 107, wing covers 108 and stringers 109. The ribs 107 are arranged generally parallel and spaced apart along the span of the wing box 105. The spars 106 run span-wise from the root to the tip of the wing box 105 converging towards its tip. The wing covers 108 are attached over the spars 106 and ribs 107 to provide the aerofoil surface of the wing box 105. The stringers 109 are attached to the inner surface of the wing covers 108 and provide stiffening thereto.

During the design process for the wing box 105 as a whole, each of its components are designed to safely handle the loads that it will be subject to in use in the operational envelope of the aircraft 101. Each component is designed with a predetermined safety margin or reserve factor that ensures that the component is safe for use under the expected loading conditions. However, it is also important that components are not over-engineered so as to become heavy or require unnecessarily large amounts of materials or engineering. In other words, a careful balance is required between building a wing box 105 that meets the load requirements in accordance with one or more predetermined safety margins, termed reserve factors (RFs), and which is also as light and efficient in its use of materials as possible.

A reserve factor (RF) for a given variable is the ratio of an allowable value for the variable to the calculated value for that variable. An RF equal or greater than 1 indicates that the variable is within the predetermined safety limit while RF less than 1 indicates that the variable exceeds the allowable value and the value of the variable has exceeded the predetermined safety limit. The design process for the wing box 105 needs to account for the loads encountered by each component for each load case and to determine that the allowable value for a given component is not exceeded while ensuring that the weight and material use of the component is minimised.

In the present embodiment, a computer system is arranged to input a model of elements of the wing box 105 and to determine, with respect to theoretical loadings, appropriate sizing for one or more of the modeled elements that meet the relevant RFs. In the present embodiment, the computer system is arranged to take into account one or more out of plane (OOP) effects when performing the sizing process. OOP effects are factors that result in the deformation of a component from its designed shape. As a result of such deformation caused by an OOP effect, the performance of a component under load may change. The computer system is described in further detail below initially with respect to FIG. 4.

Figure 2A:
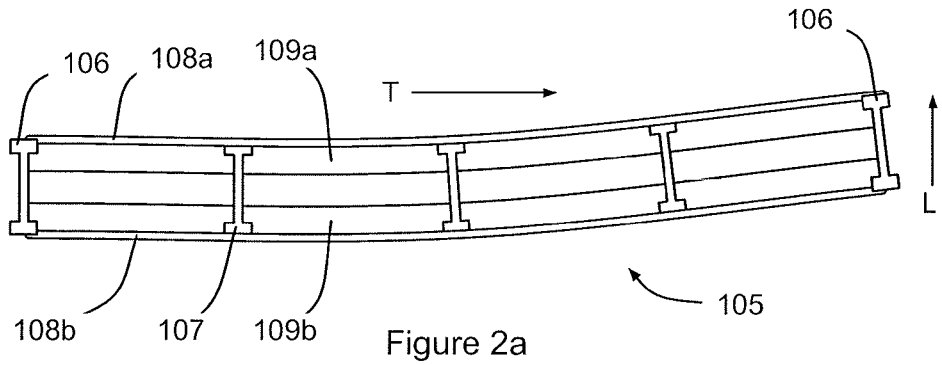
FIGS. 2a, 2b & 2c are span-wise cross sections of a wing box of FIG. 1, in selected loading scenarios.

FIG. 2a shows a span-wise cross section of the wing box 105 under a load represented by the arrow L. As can be seen from FIG. 2a, as the wing box 105 changes shape to take up the load L the upper wing cover 108a is subjected to compressive load while the lower wing cover 108b is subjected to a tensile load. In this example, the shapes of each component are assumed from their design and their behaviour in response to the loading L can thus be modeled on that basis in the design process. However, in use, the wing-box is likely to be subject to a number of OOP effects that result in the deformation of one or more of its components from their designed shape. As a result of the deformation caused by an OOP effect, the performance of a component under load may change. For example, the strain induced in a given component as a result of a given load case may exceed the allowable strain for that component. If ignored, the strain may result in the unsafe operation or failure of that component.

Figure 2B:
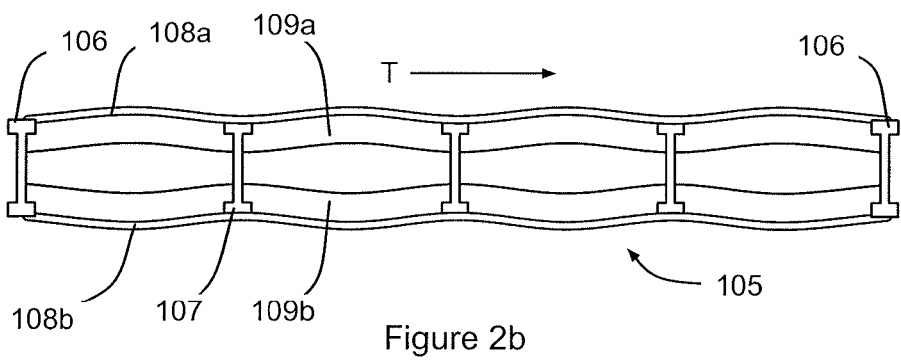
Figure 2C:
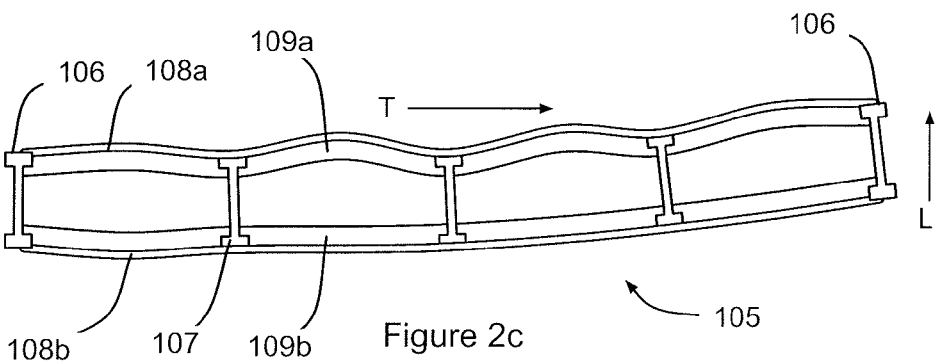

FIG. 2b shows the wing box 205 unloaded but subjected to an OOP effect in the form of internal positive pressure resulting from being loaded with fuel. The result of the fuel pressure is to effectively inflate the wing box 205 resulting in an outward bulging of the upper and lower wing covers 108a, 108b when the wing box 205. With reference to FIG. 2c, the result of the fuel OOP effect alters the performance of the wing box 105 when subjected to the load L. For example, the upper wing cover 108a is predisposed to bulging further upward and may thus be less capable of safely bearing the strains induced by the load L. Similarly, the lower wing cover 108b may need to be stretched relatively flat before it can provide its designed support for the upward load L.

Figure 3A:
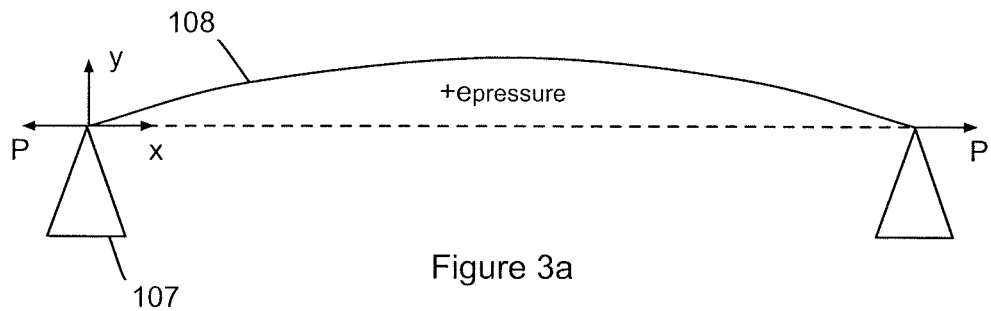
FIGS. 3a, 3b, 3c & 3d are a set of schematic illustrations of a wing box bay illustrating the results of selected out of plane (OOP) effects on the wing box of FIG. 1.
Figure 3B:
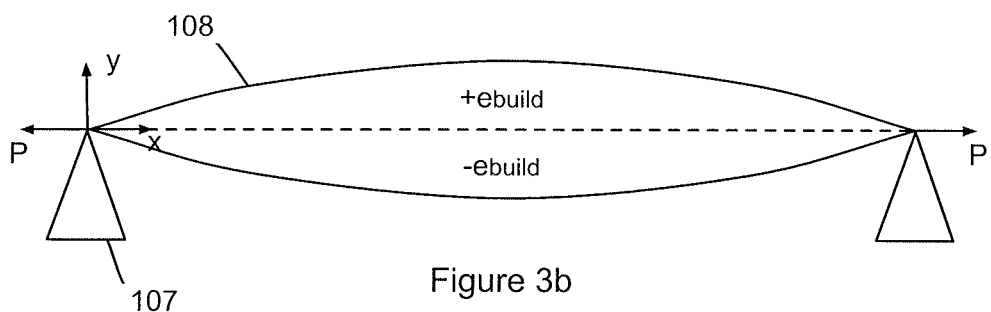

As will be understood by those skilled in the art, a number of OOP effects may have an effect on a given structure. In the present embodiment, three OOP effects are considered in the form of a pressure OOP effect, a build OOP effect and a bending OOP effect. With reference to FIG. 3a, the pressure OOP effect is the result of positive internal pressure in the wing box 105 that causes the wing covers 108 to bulge outwardly. This causes a positive eccentricity $e_{pressure}$ in the wing cover panel 108. In the present embodiment, the pressure OOP effect is $e_{pressure}$ calculated as described below using an initial input of the pressure applied on the structure. With reference to FIG. 3b, the build OOP effect is the result of manufacturing tolerances. This results in a positive or negative eccentricity $\pm e_{build}$ in the wing cover panel 108. In the present embodiment, the build OOP effect $\pm e_{build}$ is again predetermined. As a result, as described in further detail below, because the build OOP effect can result in a positive or negative eccentricity, any calculation involving the build OOP effect must be performed twice, once with a positive value and once with a negative value. In other words, the direction of the build OOP effect is indeterminate.

Figure 3C:
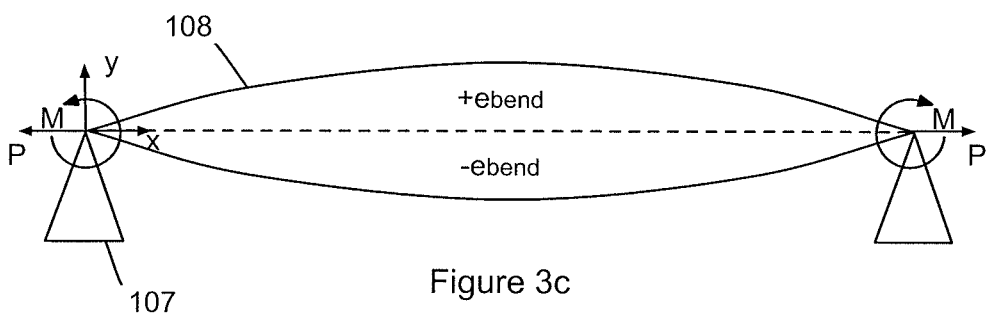

With reference to FIG. 3c, the bending OOP effect is the result of the overall bending of the wing 102. This results in a positive or negative eccentricity $\pm e_{bend}$ in the wing cover panel 108. In the present embodiment, it is assumed that the magnitude of $\pm e_{bend}$ increases linearly with the amount of overall bending of the wing 102. In other words, it is assumed that $e_{bend}$ is zero when there is no bending of the wing box 105. The magnitude of $\pm e_{bend}$ is calculated using an assumed linear variation with applied load P as follows:

$$e_{bend} = \frac{e_{max} \times P}{P_{max}}$$

Where $e_{max}$ is the maximum measured overall bending eccentricity $e_{bend}$ at the chosen rib bay, for either the limit load or ultimate load ($P_{max}$). In the present embodiment, the wing bending eccentricity $e_{bend}$ is calculated from global finite element modeling (GFEM) data for the wing box 105. A polynomial fit is performed on nodal data between rib locations. This fit is used to define the out of plane displacement $y_{nodal}$ at the centre of the rib bay. A linear trend line is then fitted between the rib locations only and the out of plane displacement $y_{linear}$ is calculated for this trend at the centre of the relevant rib bay. The wing bending eccentricity $e_{bend}$, is calculated by taking the difference of the two out of plane displacements:

$$e_{bend} = y_{nodal} - y_{linear}$$

The resultant value of $e_{bend}$ then conforms to the sign convention above, that is, if the value of $y_{nodal}$ is more negative than $y_{linear}$, then $e_{bend}$ is negative (upbend) and if $y_{nodal}$ is more positive than $y_{linear}$ then $e_{bend}$ becomes positive (downbend).

Figure 3D:
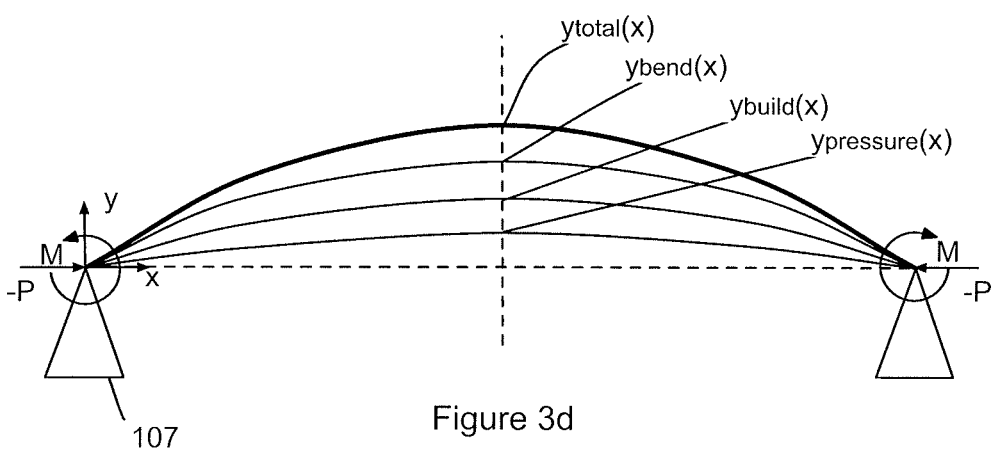

With reference to FIG. 3d, in the present embodiment, the deflections of a given wing cover 108 resulting from each of the three OOP effects are combined by superposition so as to determine the total deflection of the wing cover 108 resulting from all three OOP effects. This superposition of the displacements caused by each of the selected OOP effect is used to predict the combined effect of the different eccentricities when applying an axial load (P). The combined OOP effect displacement of the wing cover 108 in FIG. 3d is represented as follows:

$$y_{total}(x) = y(x) + y_{pressure}(x) + y_{bend}(x) + y_{build}(x)$$

Where, $y_{total}(x)$ is the total final deflection relative to the neutral line of the un-deflected wing cover 108, $y(x)$ is the change in deflection due to the application of axial load, measured from the neutral line of the initially deflected wing cover 108, $y_{pressure}(x)$ is the initial deflection of the neutral line of the wing cover 108 due to pressure, $y_{bend}(x)$ is the initial deflection of the neutral line of the wing cover 108 due to wing bending moments and $y_{build}(x)$ is the initial deflection of the neutral line of the wing cover 108 due to manufacturing tolerances.

Each of the applied OOP effect eccentricities causes an initial curvature in the wing cover 108 which will then affect the final elastic lateral deflection of the overall wing box 105. The deflected shape of the beam due to each of the loadings, applied independently, is calculated by Engineer's theory of bending. Once the final deflection of the beam is known, from the application of beam theory, then it is possible to perform the maximum material stress or strain calculation as described in further detail below. The general solution of the governing differential equation of this system, y(x), which gives the beam deflection, is measured from the neutral line of the initially curved beam if manufacturing defects are considered. It is therefore the total displacement from the undeflected shape $y_{total}(x)$ that is required for the calculation of moments in the system.

Figure 4:
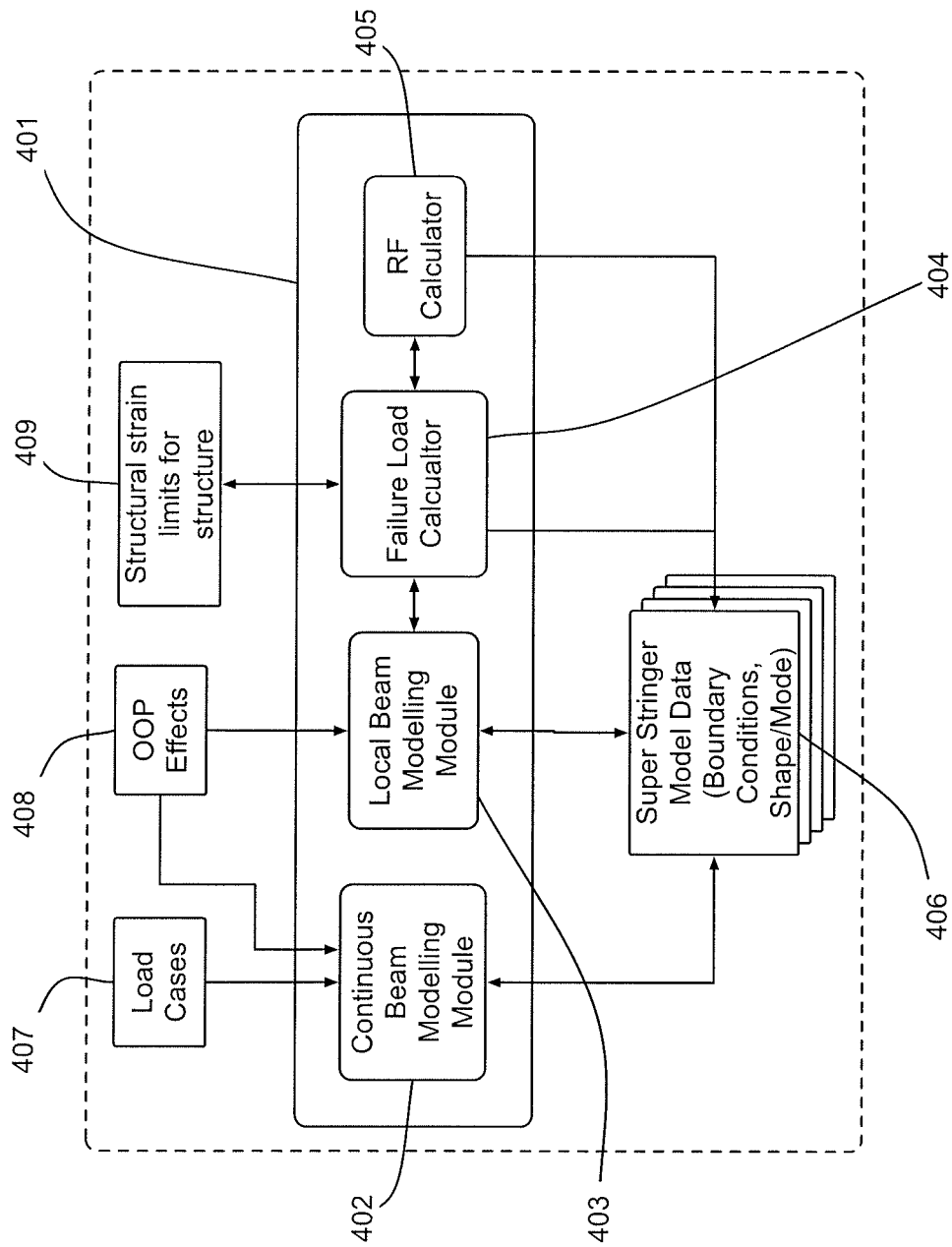
FIG. 4 is a schematic illustration of a computer system arranged to calculate stress in elements of the wing box of FIG. 1.

With reference to FIG. 4 the computer system comprising a structural stress (SS) application program 401 comprises a continuous beam (CB) modeling (CBM) module 402, a local beam (LB) modeling (LBM) module 403, a failure load calculating module 404 and an RF calculating module 405. The main input the system comprises super stringer model data 406. A super stringer is a selected example of the structure of the wing box 105 that is used as the basis for the calculations of the SS application program 401 and will be described in further detail with reference to FIG. 5 below. Further data inputs to the SS application program 401 comprise a set of load cases 407, OOP effect data 408 and structural strain limit data 409 for the structure in the form of the wing box 105. The load cases 407 comprise a set of predetermined theoretical loadings for the wing box 105. The OOP effect data 408 comprises, in the present embodiment, data representing the pressure OOP effect; build OOP effect; and the bending OOP effect.

In the present embodiment, the structural strain limit data 409 comprises the strain allowable for each relevant structural element for defined criteria such as buckling, damage tolerance or stability. In the present embodiment, this data 409 is obtained from an independent structural strain limit application program 410 that uses data representing the structure geometry, material properties, environmental conditioning and loading combination applied to perform appropriate calculations to generate the structural strain allowable for a given point in the structure with respect to given criteria, geometries and loads.

Thus, the SS application program 401 is arranged to take the inputs 406, 407, 408, 409 as described above and, in response to user selection of a load case and point in the wing box 105 for analysis, to calculate the strain at the selected point, to determine an appropriate size (width) for the associated wing cover 108 and also to calculate the RF for that point taking into account the OOP effects 408. The process can be repeated for further load cases and points in the structure as required. As noted above, the process may be performed with respect to the different structural allowables that may be provided for different failure scenarios such as reparability, damage tolerance and stability.

Figure 5:
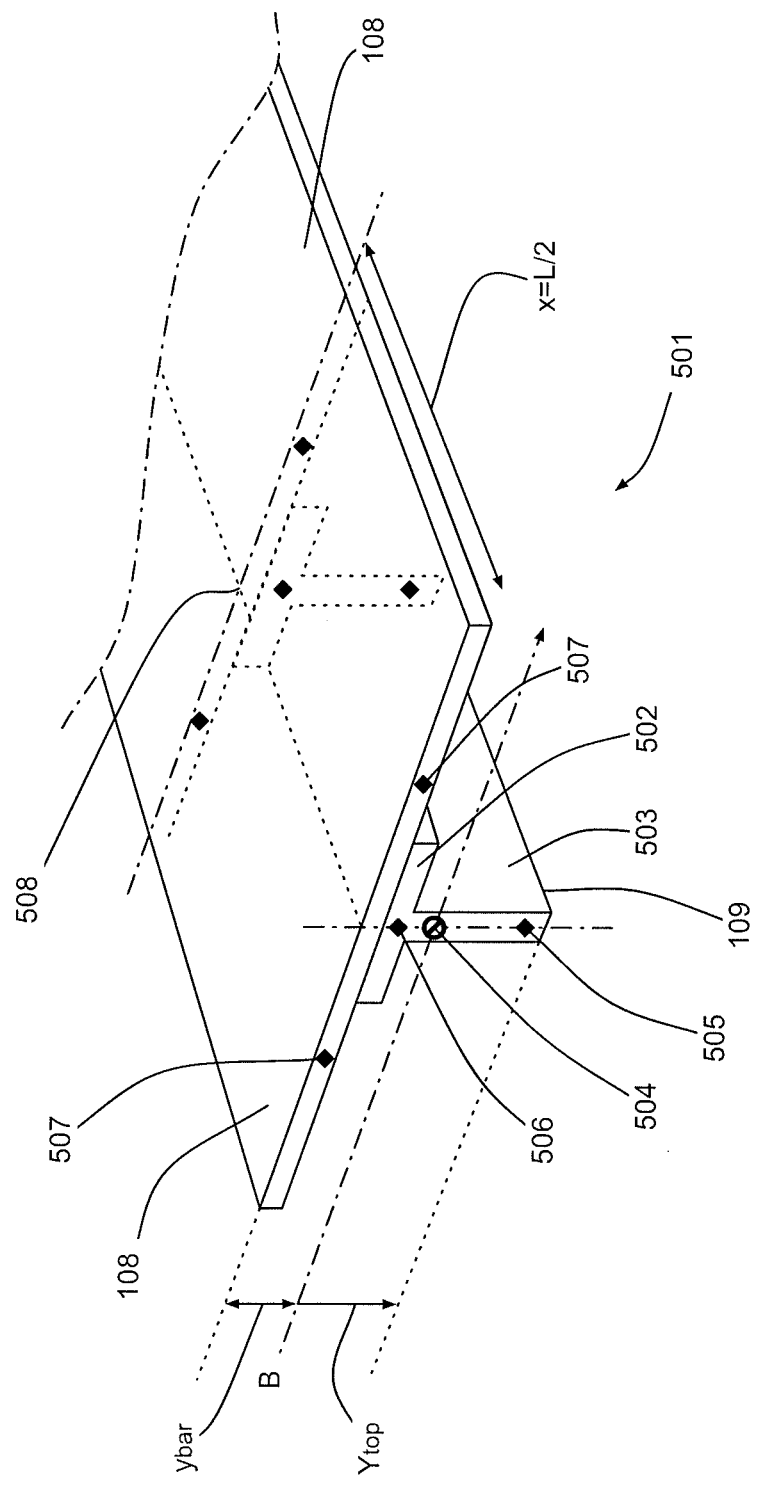
FIG. 5 is an illustration of a super-stringer model used by the computer system of FIG. 4.

With reference to FIG. 5, the super stringer model data 406 models a super stringer 501 comprising a portion of a stringer 109 and two adjacent wing covers 108 that span adjacent ribs 107 (not shown). In other words, the super stringer 501 is a section taken from the wing box 105 that extends chord-wise by one wing cover 108 either side of a selected stringer 109 and extends span-wise between two adjacent ribs 107. In the present embodiment, the stringer is "T" shaped comprising a foot 502, fixed to the underside of the joint between the two wing covers 108, and a centrally positioned blade 503 perpendicular to the foot 502. The bending axis B, perpendicular to the length of the stringer 109 runs through the centroid 504 of the super stringer 501 section. In the present embodiment, two analysis points 505, 506 are selected within the stringer 109 at the distal edge and central foot respectively. Two further analysis points 507 are selected within the wing covers 108 at their respective chord-wise midpoints. In the present embodiment, only symmetrical bending of the super stringer 501 is modeled and thus the analysis points 505, 506, 507 are only selected at the critical sections of the super stringer 501, that is, each end of the span L of the super stringer 501, where x=0 or x=1, and at the midpoint 508 of the super stringer 501 where x=L/2. As will be understood by those skilled in the art, due to symmetry, analysis at the point x=0 and x=L will provide the same results. Further significant dimensions of the super stringer 501 that will be referred to below are the distance from the centroid 504 to the top of the stringer blade 503, referred to herein as $y_{top}$, and the distance between the centroid 504 and the external surface of the wing covers 108, referred to herein as $y_{bar}$.

Figure 6A:
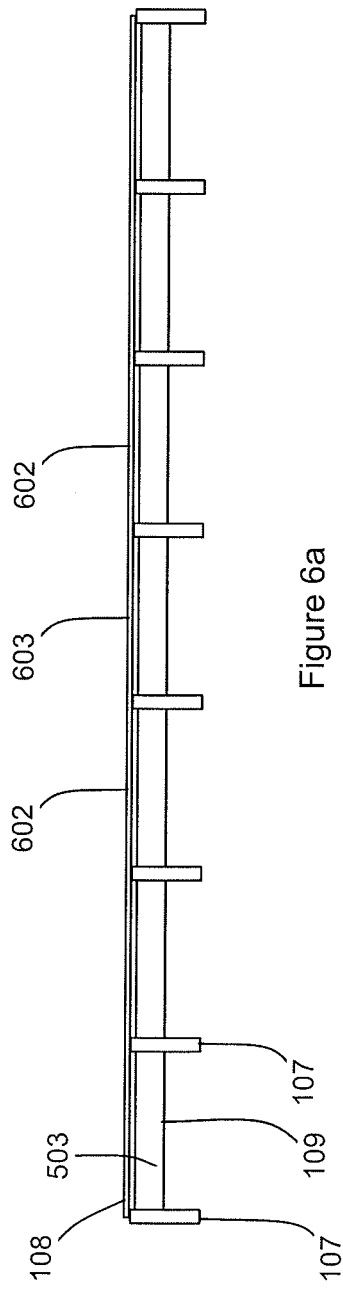
FIG. 6a is an illustration of a continuous beam (CB) model of super-stringers used by the computer system of FIG. 4.

In the present embodiment, the continuous beam modeling (CBM) module 402 is arranged to model the behaviour of the wing box 105 by idealising it as a continuous beam comprising successive multiples of the super stringers 501 as shown in FIG. 6a. In the present embodiment, the continuous beam 601 comprises seven successive super stringers 501 simply supported across eight ribs 107, thus providing seven rib bays 602, 603. The behaviour of the super-stringer 501 may vary significantly depending on the number of bays selected for the CB model. The choice of seven bays provides sufficient insulation to the central rib bays from the effects of the beam-ends while minimising the number of bays to be modeled.

Figure 6B:
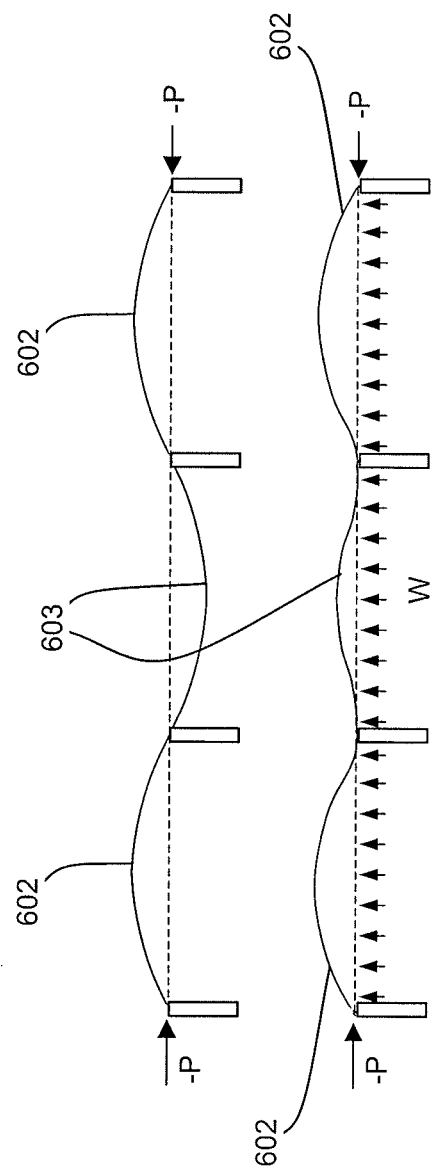
FIG. 6b is a schematic illustration of a plurality of states considered in the modeling of the super-stringer of FIG. 6a in response to respective load cases.

The CBM module 402 is further arranged to analyze both the central bay 603 and one of its adjacent bays. Two such adjacent bays 602, 603 are analyzed so as to capture the two possible modes of deflection of the respective super stringers 501. In the first mode, as shown lowermost in FIG. 6b, the central bay 603 is deflected in one direction and the adjacent bay 602 is deflected in the same direction. This first mode may occur, for example, where the running load P is relatively low compared to the buckling load and an internal pressure w is sufficiently strong to bulge the super stringers of all bays outward. In the second mode, as shown uppermost in FIG. 6b, central bay 603 is deflected in one direction and the adjacent bay 602 is deflected in the opposite direction. This second mode may occur, for example, where the running load is strong enough and close to the buckling load, relative to other loads such as an internal pressure load, to cause inward bulging in the central bay 603 and outward buckling in its adjacent bays 602.

Figure 7:
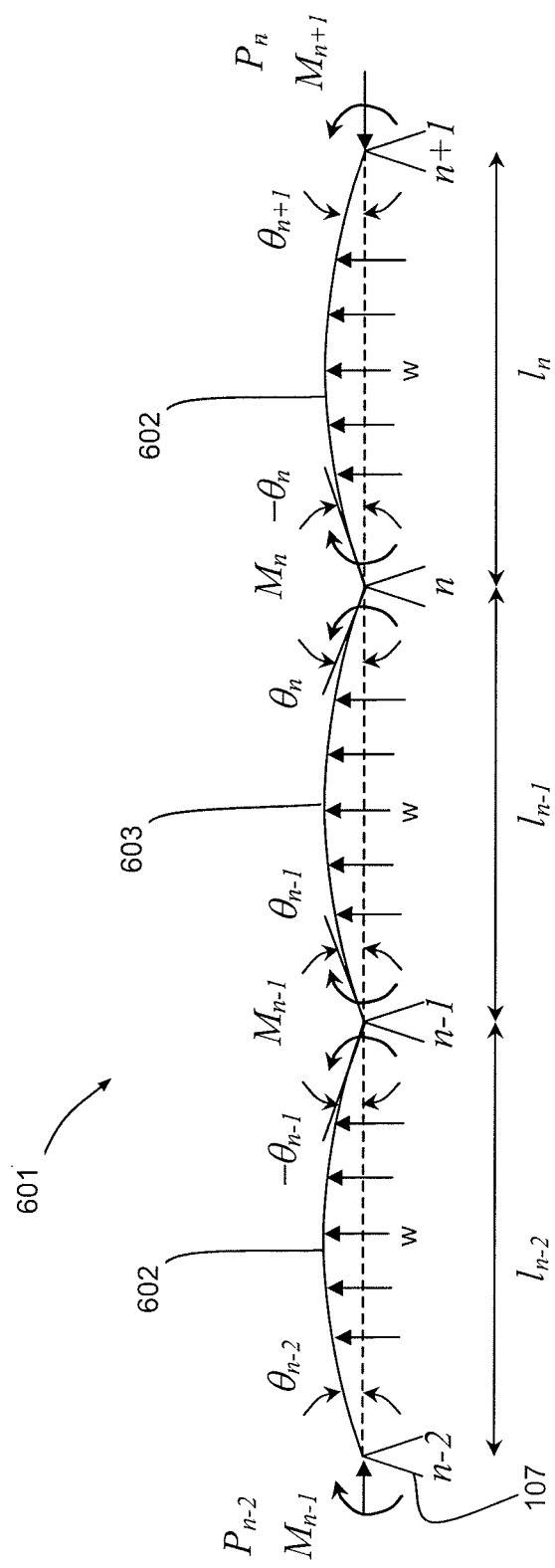
FIG. 7 is an illustration of the application of Clapeyron's Theorem to the CB model of FIG. 6a to determine boundary pressures and moments taking into account OOP effects.

With reference to FIG. 7 the CBM module 402 is arranged to apply Clapeyron's Theorem to the CBM 601 in order to calculate the boundary conditions, in the form of boundary loads, moments and rotations, for the central rib bay 603 and an adjacent rib bay 602. Each support, on the form of a rib 107, has its own set of moments M and rotations θ, denoted by subscripts n, n+1. The angles θ are considered positive when in the same direction as the bending moments M in FIG. 7. The bending moments M at each intermediate support are unknown and are provided in the solution. The application of Clapeyron's Theorem to the CBM 601, with simply support conditions, initial moment $M_0$ and a constant w pressure is defined as follows:

$$\theta = \frac{w}{kP}(\tan u - u) + \frac{M_0}{PL}\frac{kl(1-\cos(kl))}{\sin(kl)},$$

$$\text{where } u = \frac{kL}{2} \text{ and } k = \sqrt{\frac{P}{EI}}$$

The compatibility of rotations is enforced at each intermediate support, that is, the rotations of the left and right spans are forced to be of the same value and opposite sign as can be seen in FIG. 7. Given m supports 105, this provides m−2 equations as follows:

$$\phi M_{n-1} + 4\psi M_n + M_{n+1}\phi = -\frac{12EI\theta}{L},$$

$$\text{where } \phi = \frac{3}{u}\left(\frac{1}{\sin(2u)} - \frac{1}{2u}\right) \text{ and } \psi = \frac{3}{2u}\left(\frac{1}{2u} - \frac{1}{\tan(2u)}\right)$$

The additional two equations required come from the boundary conditions at the ends of the beam. In this case, it is assumed that the ends are simply supported and that there is an initial known bending moment:

$$M_1 = M_0 \text{ and } M_m = M_0',$$

where $M_0$ and $M_0'$ are the end moments.

The equations obtained can be joined together and expressed in a matrix system as follows:

$$\underbrace{\begin{bmatrix} 1 & 0 & 0 & \cdots & \cdots & \cdots & 0 \\ \phi & 4\psi & \phi & 0 & \cdots & \cdots & 0 \\ 0 & \phi & 4\psi & \phi & 0 & \cdots & 0 \\ \cdots & \cdots & \cdots & \cdots & \cdots & \cdots & \cdots \\ 0 & \cdots & 0 & \phi & 4\psi & \phi & 0 \\ 0 & \cdots & \cdots & 0 & \phi & 4\psi & \phi \\ 0 & \cdots & \cdots & \cdots & 0 & 0 & 1 \end{bmatrix}}_{A} \underbrace{\begin{Bmatrix} M_1 \\ M_2 \\ M_3 \\ \cdots \\ M_{m-2} \\ M_{m-1} \\ M_m \end{Bmatrix}}_{X} = \underbrace{\begin{Bmatrix} M_0 \\ 0 \\ 0 \\ \cdots \\ 0 \\ 0 \\ M_0' \end{Bmatrix} + -\frac{12EI}{L}\theta\begin{Bmatrix} 0 \\ 1 \\ 1 \\ \cdots \\ 1 \\ 1 \\ 0 \end{Bmatrix}}_{B}$$

Therefore, the moments can be obtained as $\{X\} = [A]^{-1}\{B\}$.

Figure 8:
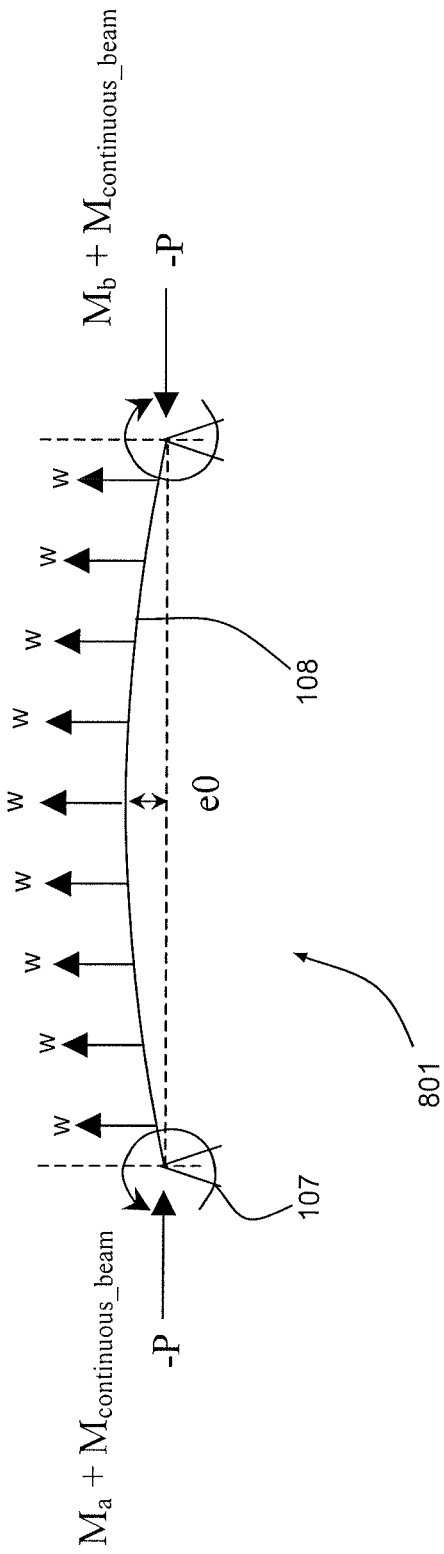
FIG. 8 is an illustration of a local beam (LB) model of the super stringer loaded with boundary pressures and moments from the CB model and OOP effects.

With reference to FIG. 8, the local beam modeling (LBM) module 403 is arranged to calculate the internal load/strain distribution within a local beam model (LBM) 801. The LBM 801 comprises a single super stringer 501. The LBM module 403 is arranged to calculate the strain at a user selected location in the super stringer 501 taking into account the boundary effects calculated by the CBM module 402 for the CBM 601 and the OOP effects described above with reference to FIGS. 3a, 3b & 3c. In FIG. 8 the pressure OOP effect is illustrated as a uniform pressure w acting on the LBM 801, the build OOP effect is illustrated as a positive displacement $e_{build}$ and the bend OOP effect is denoted by the associated moments $M_a$, $M_b$ and end loads P. The LBM module 403 calculates the displacements, strains and bending moments using the LBM formula described in Appendix I, augmented with two additional moments $M_{continuous\ beam}$ that simulate the stiffness provided by adjacent super stringers 501. These $M_{continuous\ beam}$ moments are provided by CBM module 402 as described above. Thus the formula for calculating the strain at the selected analysis point (x, y) 505, 506, 507 in the LBM 801 is as follows:

$$\varepsilon_{max} = \frac{P}{EA} - \frac{y_{top} \cdot M_{max}}{EI}$$

Figure 9:
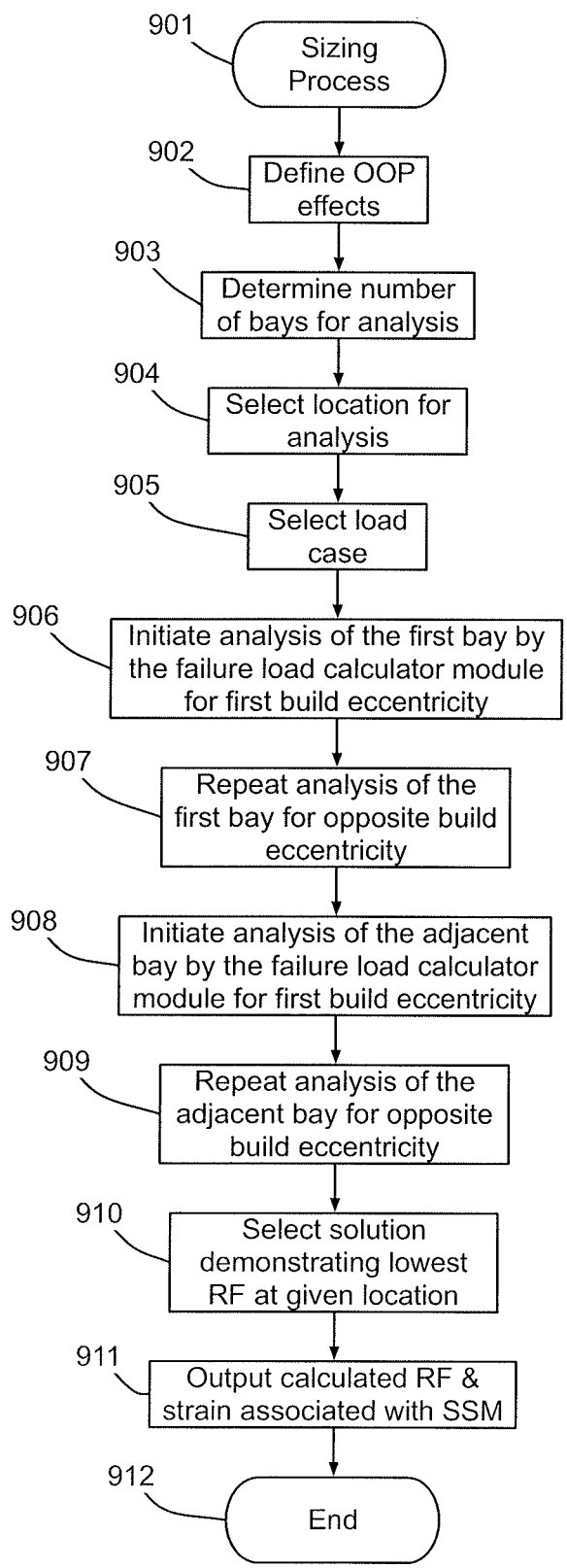
FIGS. 9 to 14 are a set of flow charts illustrating the processing performed by the computer system of FIG. 4 when determining the strain induced at a selected point in the super stringer in response to a load, taking into account one or more OOP effects.

The processing performed by the SS application program 401 will now be described further with reference to the flow chart of FIG. 9. Processing is initiated by a user at step 901 and then moves to step 902. At step 902, the OOP effects are determined which, in the present embodiment, comprise the magnitude and sign of the wing bending OOP effect $e_{bend}$, the magnitude of the pressure OOP effect $e_{pressure}$, which is assumed to act in the outward direction from the stringer blade 503 to the stringer foot 502, and the magnitude of the build OOP effect $e_{build}$. Processing then moves to step 903 where the number of rib bays 602, 603 for the CBM 601 is selected and processing moves to step 904. At step 904, the location for analysis is selected from the available analysis points 505, 506, 507 and processing moves to step 905. At step 905 the relevant load case 407 is selected and processing moves to step 906. At step 906 a first rib bay 603 is selected for analysis by the failure load calculator 404 with respect to the first build OOP effect $+e_{build}$ and processing then moves to step 907. At step 907 the analysis of the first rib bay 603 is repeated by the failure load calculator 404 with respect to the opposite build OOP effect $-e_{build}$ and processing then moves to step 908. At step 908 the adjacent rib bay 602 is selected for analysis by the failure load calculator 404 with respect to the first build OOP effect $+e_{build}$ and processing then moves to step 909. At step 909 the analysis of the adjacent rib bay 602 is repeated by the failure load calculator 404 with respect to the opposite build OOP effect $-e_{build}$ and processing then moves to step 910. At step 910 the solution comprising the lowest RF for the selected analysis point 505, 506, 507 is selected from the four solutions calculated in the previous four steps 906, 907, 908, 909 and processing moves to step 911. At step 911 the selected solution, RF and calculated strain is output in association with the relevant sized super stringer model 501. Processing then moves to step 912 and ends.

Figure 10:
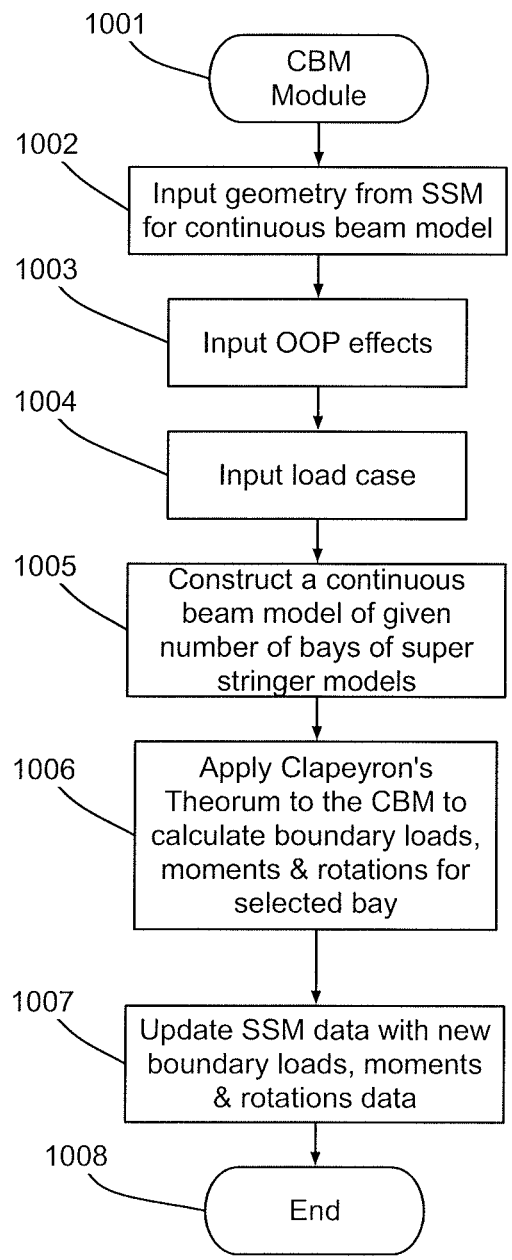

The processing performed by the CBM module 402 will now be described further with reference to the flow chart of FIG. 10. Processing is initiated at step 1001 by the failure load calculator 404 as a result of steps 906, 907, 908, 909 of the processing of the SS application program 401. Processing then moves to step 1002 where the relevant geometry from the super stringer model 501 is input and processing moves to step 1003. At step 1003 the defined OOP effects are input and processing moves to step 1004. At step 1004 the selected load case is input and processing moves to step 1005. At step 1005 the continuous beam model 601 is constructed from the selected number of rib bays each comprising a super stringer model 501 and processing moves to step 1006. At step 1006 Clapeyron's Theorem is applied to the CBM 601 to determine the boundary conditions in the form of the loads, moments and rotations for the relevant rib bay and processing then moves to step 1007. At step 1007 the SSM 501 is updated with the newly calculated boundary loads, moments and rotations. Processing then moves to step 1008 and ends.

Figure 11:
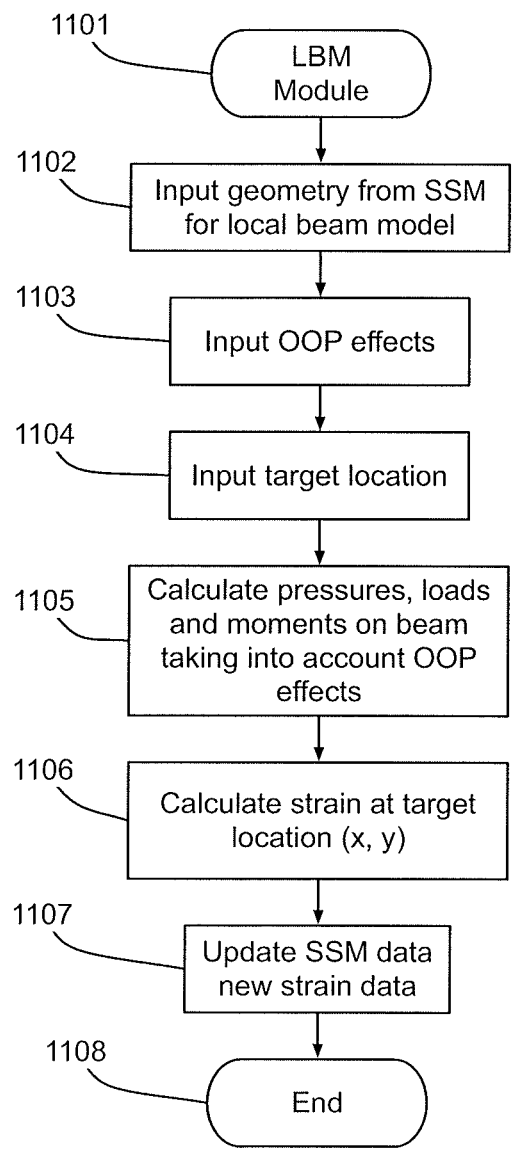

The processing performed by the LBM module 403 will now be described further with reference to the flow chart of FIG. 11. Processing is initiated at step 1101 by the failure load calculator 404 as a result of steps 906, 907, 908, 909 of the processing of the SS application program 401. Processing then moves to step 1102 where the relevant geometry from the super stringer model 501 is input and processing moves to step 1103. At step 1103 the defined OOP effects are input and processing moves to step 1104. At step 1104 the selected target location in the form of one of the analysis point 505, 506, 507 is input and processing moves to step 1105. At step 1105 the pressures, loads and moments on the SSM 501 are calculated taking into account the OOP effects as described above and processing then moves to step 1106. At step 1106 the strain at the relevant analysis point 505, 506, 507 is calculated as described above and processing moves to step 1107. At step 1107 the SSM 501 is updated with the newly calculated strain data. Processing then moves to step 1108 and ends.

Figure 12:
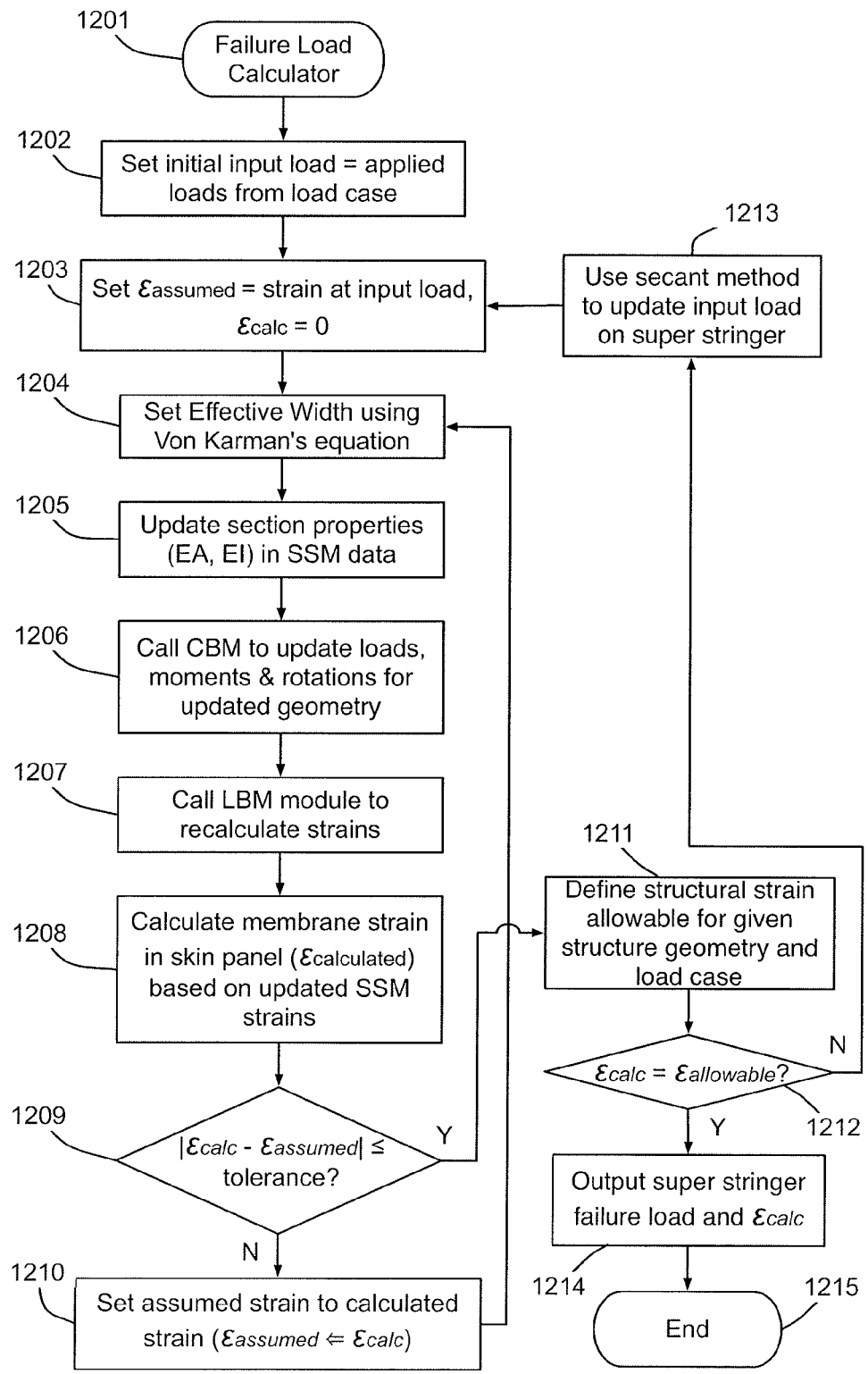

The processing performed by the failure load calculator 404 will now be described further with reference to the flow chart of FIG. 12. Processing is initiated at step 1201 by steps 906, 907, 908, 909 of the processing of the SS application program 401 and processing then moves to step 1202. At step 1202 the initial input load for the calculation, in the form of compression end loads, is set in accordance with the applied loads from the selected load case and processing moves to step 1203. At step 1203 the assumed strain $\epsilon_{assumed}$ is set to the strain at the input load and the calculated strain $\epsilon_{calculated}$ is set to zero and processing moves to step 1204. At step 1204 the effective width of the wing cover panels 108 of the super stringer 501 are set using Von Kerman's equation as described further below with reference to FIG. 13 and processing moves to step 1205. At step 1205 the section properties are updated in the super stringer model 501 to take into account the effective width of the wing cover panels 108 and the resulting effect on the bending stiffness EI and membrane stiffness EA and processing moves to step 1206. At step 1206 the CBM module 402 is called to update the loads, moments and rotations in the SSM 501 for the revised geometry and processing moves to step 1207. At step 1207 the LBM module 403 is called to recalculate the strains in the SSM 501 for the updated geometry and processing moves to step 1208. At step 1208 the membrane strain $\epsilon_{calculated}$ in the wing cover panel 108 of the SSM 501 is updated based on the strains in the updated SSM 501 and processing moves to step 1209. At step 1209 the difference between calculated strain $\epsilon_{calculated}$ and the assumed strain $\epsilon_{assumed}$ is compared to a predetermined tolerance. If the difference is greater than the tolerance then processing moves to step 1210. At step 1210 the assumed strain $\epsilon_{assumed}$ is set to the calculated strain $\epsilon_{calculated}$ and processing returns to step 1204 which is repeated along with steps 1205 to 1209 as described above. If at step 1209 the difference is less than or equal to the tolerance then processing moves to step 1211. At step 1211 the structural strain allowable $\epsilon_{allowable}$ is obtained from the structural strain limit application program 409 for the structure and geometry of the revised SSM 501 and processing moves to step 1212. At step 1212 the calculated strain $\epsilon_{calculated}$ is compared to the structural strain allowable $\epsilon_{allowable}$ and unless the two are equal then processing moves to step 1213. At step 1213 the Secant Method is used to reselect the input load for the processing of steps 1203 to 1209 which are then repeated as described above. If at step 1212 the calculated strain $\epsilon_{calculated}$ is equal to the structural strain allowable $\epsilon_{allowable}$ then processing moves to step 1214. At step 1214 the failure load, that is the input load at which the calculated strain $\epsilon_{calculated}$ at the selected analysis point equals the structural strain allowable $\epsilon_{allowable}$, along with the calculated strain $\epsilon_{calculated}$ are saved to the SSM 501. Processing then moves to step 1215 and ends.

During the application of the sizing process described herein, it is possible to encounter panel geometries that exhibit skin local buckling before failing in a global Euler buckling mode. While the buckling load may be assumed to be independent of the OOP effects, if skin local buckling occurs before the OOP failure, for example under either reparability or damage tolerance criteria, then the real stiffness provided by the skin 108 to the super stringer 501 needs to be considered. This scenario is accounted for by the iterative loop of steps 1204 to 1210 in combination with the processing of FIG. 13 described below which are arranged to calculate the effective skin width reduction, under the post-buckling regime, for each applied end load to the super-stringer 501. When local buckling occurs in the skin, the skin panel 108 becomes less able to support the applied loads than an unbuckled panel. The skin panel 108 may continue to support applied loads before it finally collapses and will act as if it has a reduced bending stiffness EI and membrane stiffness EA. The effective skin width is then used to calculate the effective section properties of the skin 108, after local buckling has occurred.

The effective width is calculated using the Von Karman criteria and recalculates the effective skin width accounting for a ratio between the skin buckling allowable and the strain evolved in the skin at a given load. The process modifies the width of the skin panel 108 in an iterative loop for each given end load, but leaves the stringer 109 unmodified. Hence it affects the section properties, such as EI, EA and the location of the centroid 504, which are recalculated each time the skin width changes at each iteration step.

The new section properties and updated loads are then used to calculate the OOP strain at the selected target location 505, 506, 507 and also the membrane strain in the skin 108. The membrane strain is then used to determine convergence of the effective width iteration at step 1209. Once converged, the geometry of the super-stringer model 501 consists of the original stringer 109 and a skin panel 108, the properties of which represent the skin properties once local buckling has occurred. As noted above, only the compressive part of the load is considered in the calculation of effective width, in line with the assumption of considering the OOP effects in relation to the CBM 601 described above.

Figure 13:
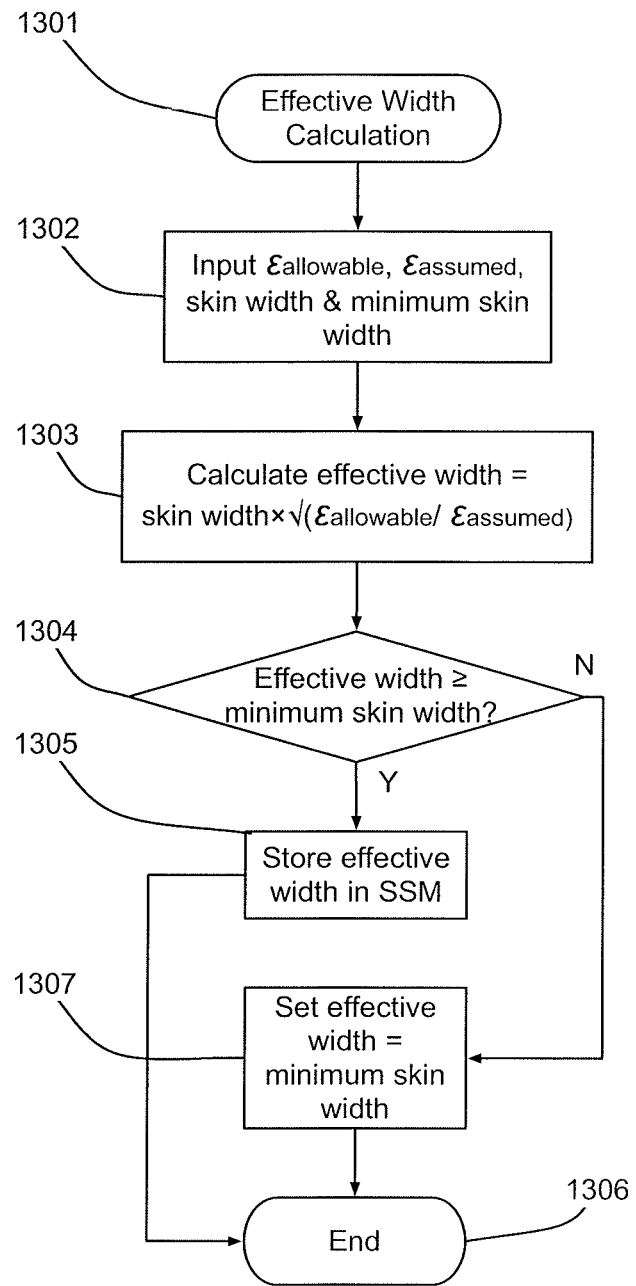

The processing performed by the failure load calculator 404 when setting the effective skin width in step 1204 of FIG. 12 will now be described further with reference to the flow chart of FIG. 13. Processing is initiated at step 1301 and processing then moves to step 1302. At step 1302 the structural strain allowable $\epsilon_{allowable}$, assumed strain $\epsilon_{assumed}$, current skin width and minimum skin width are input from the SSM 501 and processing moves to step 1303. At step 1303 the effective skin width is calculated using Von Karmen's formula as follows:

$$EffectiveSkinWidth = CurrentSkinWidth \times \sqrt{\epsilon_{allowable} / \epsilon_{assumed}}$$

Processing then moves to step 1304 where the newly determined effective skin width is compared to the minimum skin width. If the effective skin width is greater than or equal to the minimum skin width then processing moves to step 1305. At step 1305 the effective skin width is stored in the SSM 501. Processing then moves to step 1306 and ends. If at step 1304 the effective skin width is less than the minimum skin width then processing moves to step 1307. At step 1307 the effective skin width is set to the minimum skin width and stored in the SSM 501. Processing then moves to step 1306 and ends.

Figure 14:
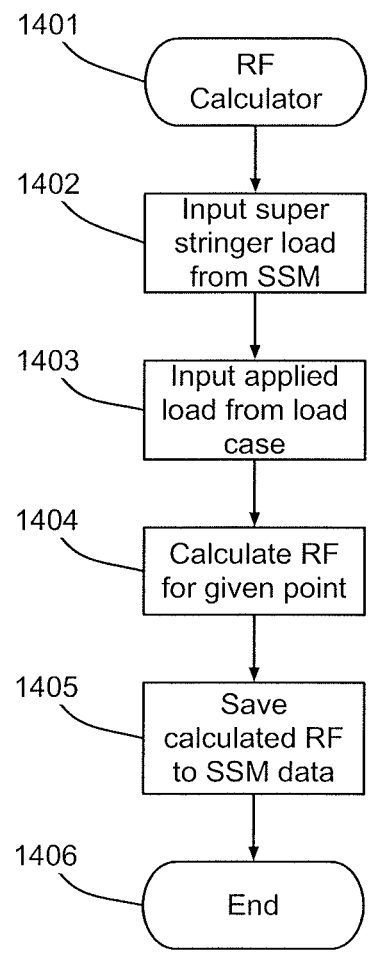

The processing performed by the RF calculator 405 in response to the updating of the stringer failure load and calculated strain $\epsilon_{calculated}$ in step 1214 of the processing of the failure load calculator 404 will now be described further with reference to the flow chart of FIG. 14. Processing is initiated at step 1401 in response to the updating of the super stringer failure load and calculated strain $\epsilon_{calculated}$ in the SSM 501 and processing moves to step 1402. At step 1402 the super stringer failure load is input from the SSM 501 and processing moves to step 1403. At step 1403 the applied load is input from the selected load case and processing moves to step 1404. At step 1404 the RF is calculated with reference to the selected point using the following formula:

$$RF = \frac{Load_{allowable}}{Load_{applied}}$$

Processing then moves to step 1405 where the calculated RF is saved to the SSM 501. Processing then move to step 1406 and ends.

As will be understood by those in the art, the analysis points in the super stringer model 501 may be selected or modified depending on the type of analysis being performed. In the embodiment described above, the analysis points 505, 506, 507 are selected for determining the buckling tolerance taking into account the selected OOP effects. The analysis may be performed for other tolerance criteria such as damage, reparability or stability under selected OOP effects. Each such process thus provides a relevant tolerance RF with regard to the OOP effects, for use in downstream processes for engineering the relevant structure.

Embodiments of the invention may be arranged to output the panel size and RF for any required performance criteria. In the embodiment described above the criteria is the buckling limit or tolerance. Other criteria may comprise damage tolerance, reparability limits or any other user defined criteria. For each such criterion a suitable strain allowable can then be defined. Furthermore, a set of analysis points may be defined suitable for each such criterion.

For any criteria, the allowable may be fixed or variable. Variable allowables are updated to take into account changes to the modeled structure. Variable allowables are generally provided by a specific module in the modeling system or by a specialized external system. Variable allowables thereby enable the iteration of the sizing and RF calculation process.

Embodiments of the invention may be provided as an additional function or module for a structural optimization system. In such an embodiment, the geometry of a given structure and an associated load case would be input from the optimization system and the panel size and relevant RF would be output back to the optimization system. The optimization system may then provide a modified geometry for further processing by the embodiment of the invention. Thus, the processing by the embodiment of the invention may be iterative. An example of such an optimization system is described in US2008103740A1.

In another embodiment, the system is provided as a stand-alone application program for calculating panel size and RF for a predetermined criteria or performance limit of a structure. In this embodiment, the system is provided with the geometry of the relevant structure, a load case in the form of an input load and a strain allowable for the relevant criterion for a defined location. In response, the system outputs a panel size and RF for the strain allowable. The geometry, load and allowable may be modified manually for further iterations.

Embodiments of the invention may be employed for modeling any desired material. For example, for aircraft structures comprising materials such as metal or composite materials such as carbon fibre reinforced plastics (CFRP) may be modeled. The structures may comprise a single material or a combination of such materials.

Embodiments of the invention may be employed for any structure where OOP effects could be considered relevant. While the embodiments described may be applied to pressurized box structures such as wings, horizontal tail plane and a centre wing box, which are essentially flat stiffened panels, it is also possible to modify this method to account for curved stiffened panels exposed to OOP effects. When modeling curved stiffened panels which are part of a pressurized structure, such as those comprising the fuselage of an aircraft, the appropriate mathematical formulae area applied to account for the effect of the curvature on the applied load, so as to ensure that the applied loads and OOP effects are all resolved into an appropriate, common axis system. The general requirement to assess different critical criteria and provide target strain or load allowables apply, as described in the embodiments described above, while ensuring the criteria are selected as being most appropriate for sizing curved stiffened panels used in that particular application. As will be understood by those skilled in the art, embodiments may be applied to any suitable structure in any engineering field and are not limited to aircraft structures.

It will be understood by those skilled in the art that the apparatus that embodies a part or all of the present invention may be a general purpose device having software arranged to provide a part or all of an embodiment of the invention. The device could be a single device or a group of devices and the software could be a single program or a set of programs. Furthermore, any or all of the software used to implement the invention can be communicated via any suitable transmission or storage means so that the software can be loaded onto one or more devices.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details of the representative apparatus and method, and illustrative examples shown and described. Accordingly, departures may be made from such details without departure from the scope of applicant's general inventive concept.

APPENDIX I

Derivation of LBM Module Formulae for Calculating Strain at Selected Point

This appendix provides the derivation of the formula used by the LBM module 403 for calculating the strain at selected point in a super stringer 501.

Determining the Moments:

In the present embodiment, the moment at any point x, $M_{total}(x)$ in the LBM 801 is defined taking consideration of axial compression loading P (−P) only. Any OOP effect shearing deformations and shorting of the beam axis are not considered. On this basis $M_{total}(x)$ is then defined as follows:

$$M_{total}(x) = -P \cdot y_{total}(x) + M_{0pres} + M_{0applied\_couple} + M_{0build}$$

The second derivative provides the moment and is defined by equation 1 as follows:

$$-EI\frac{d^2 y_{total}}{dx^2} = -P \cdot y_{total} + M_{0pres} + M_{0applied\_couple} + M_{0build}$$

Where $y_{total}(x) = y(x) + y_{pres}(x) + y_{applied\_couple}(x) + y_{build}(x)$, as defined above with reference to FIG. 3d, and the moments $M_0$ represent the moment at any position x due to the corresponding lateral load. Note that y(x) is the change in displacement from the initially deflected shape, due to application of axial load P. P is negative to denote compression loads. Substituting for $y_{total}(x)$ in equation 1 gives equation 2 as follows:

$$-EI\frac{d^2(y + y_{pres} + y_{applied} + y_{build})}{dx^2} =$$
$$-P \cdot (y + y_{pres} + y_{applied} + y_{build}) + + M_{0pres} + M_{0applied\_couple} + M_{0build}$$

or $$-EI\frac{d^2 y}{dx^2} - EI\frac{d^2(y_{pres} + y_{applied} + y_{build})}{dx^2} - -$$
$$P \cdot (y + y_{pres} + y_{applied} + y_{build}) + + M_{0pres} + M_{0applied\_couple} + M_{0build}$$

Note that the individual curvatures relate to the moments by the following expressions:

$$-EI\frac{d^2 y_{pres}}{dx^2} = M_{0pres}, \quad -EI\frac{d^2 y_{applied}}{dx^2} = M_{0applied},$$
$$-EI\frac{d^2 y_{build}}{dx^2} = M_{0build}$$

Therefore, substituting these into equation 2 gives equation 3 as follows:

$$-EI\frac{d^2 y}{dx^2} = -P \cdot (y + y_{pres} + y_{applied} + y_{build})$$

Note that P<0 and the beam has the length L and constant bending stiffness EI. The deflection profile for each type of OOP effect, without any coupling to the axial load, P, is obtained as follows:

Pressure: A constant distributed load of magnitude w is applied to a beam of constant bending stiffness EI and length L and the displacement profile $y_{pres}(x)$ at each point x along the beam is calculated, with no coupling to load P, as follows:

$$y_{pres} = -\frac{w \cdot L \cdot x^3}{12 \cdot EI} + \frac{w \cdot x^4}{24 \cdot EI} + \frac{w \cdot L^3 \cdot x}{24 \cdot EI}$$

Build Eccentricity: An initial displacement of magnitude $e_0$ is applied to the centre of the beam and the deflection due to this initial defect is calculated, with no coupling to load P, as follows:

$$y_{build} = e_0 \cdot \sin\left(\frac{\pi \cdot x}{L}\right)$$

Overall Bending Moment: The wing bending moment is modeled by the application of a moment load to each support individually. The moment on the left support is defined as magnitude $M_a$ and the moment on the right hand support is defined as magnitude $M_b$. This beam is then analyzed and the displacement profile due to only the applied moments $y_{applied\_couple}(x)$ is calculated, with no coupling to load P, as follows:

$$y_{applied} = -\frac{M_a \cdot x^2}{2 \cdot EI} + \left(\frac{M_a - M_b}{6 \cdot EI}\right) \cdot \frac{x^3}{L} + \left[\frac{M_a \cdot L}{2 \cdot EI} + \frac{(M_b - M_a) \cdot L}{6 \cdot EI}\right] \cdot x$$

These effects are substituted into equation 3, which is then rearranged to give equation 4, the governing differential equation of the system, as follows:

$$\frac{d^2 y}{dx^2} + \mu^2 \cdot y = x^4 \cdot \left[\frac{-w \cdot \mu^2}{24 \cdot EI}\right] +$$
$$x^3 \cdot \left[\frac{\mu^2 \cdot w \cdot L}{12 \cdot EI} - \frac{\mu^2}{6}\left(\frac{M_a - M_b}{L \cdot EI}\right)\right] + \ldots \ldots + x^2 \cdot \left[\frac{\mu^2 \cdot M_a}{2 \cdot EI}\right] +$$
$$x \cdot \left[-\frac{\mu^2 \cdot w \cdot L^3}{24 \cdot EI} - \frac{\mu^2 \cdot M_a \cdot L}{2 \cdot EI} + \frac{\mu^2 (M_a - M_b) \cdot L}{6 \cdot EI}\right] - \ldots \ldots -$$
$$\left[\mu^2 \cdot e_0 \cdot \sin\left(\frac{\pi \cdot x}{L}\right)\right]$$

Where $\mu^2 = \left(\frac{-P}{EI}\right)$

Equation 4 is then solved to obtain a general solution y(x) in the form of equation 5 as follows:

$$y(x) = A \cdot \sin(\mu \cdot x) + B \cdot \cos(\mu \cdot x) + a_1 \cdot x^4 +$$
$$a_2 \cdot x^3 + a_3 \cdot x^2 + a_4 \cdot x + a_5 + \ldots \ldots + a_6 \cdot \sin\left(\frac{\pi \cdot x}{L}\right)$$

And the second derivative of equation 5 is defined in equation 6 as follows:

$$\frac{d^2 y}{dx^2} = -A \cdot \mu^2 \cdot \sin(\mu \cdot x) - B \cdot \mu^2 \cdot \cos(\mu \cdot x) +$$
$$12 \cdot a_1 \cdot x^2 + 6 \cdot a_2 \cdot x + 2 \cdot a_3 - \ldots \ldots - \left(\frac{\pi^2}{L^2}\right) \cdot a_6 \cdot \sin\left(\frac{\pi \cdot x}{L}\right)$$

Substituting the above expressions for $$\frac{d^2 y}{dx^2}$$

and y(x) into equation 4 then yields the following equality:

$$[a_1 \cdot \mu^2] \cdot x^4 + [a_2 \cdot \mu^2] \cdot x^3 + [a_3 \cdot \mu^2 + 12 \cdot a_1] \cdot x^2 +$$
$$[a_4 \cdot \mu^2 + 6 \cdot a_2] \cdot x + [a_5 \cdot \mu^2 + 2 \cdot a_3] + \ldots$$
$$\ldots + [a_6] \cdot \left[\mu^2 - \left(\frac{\pi^2}{L^2}\right)\right] \cdot \sin\left(\frac{\pi \cdot x}{L}\right) == \left[-\frac{w \cdot \mu^2}{24 \cdot EI}\right] \cdot$$
$$x^4 + \left[\frac{w \cdot L}{12 \cdot EI} - \left(\frac{M_a - M_b}{6 \cdot L \cdot EI}\right)\right] \cdot \mu^2 \cdot x^3 + \left[\frac{\mu^2 \cdot M_a}{2 \cdot EI}\right] \cdot x^2 + \ldots$$

-continued $$\ldots + \left[-\frac{w \cdot L^3}{24 \cdot EI} - \frac{M_a \cdot L}{2 \cdot EI} + \frac{(M_a - M_b) \cdot L}{6 \cdot EI}\right] \cdot \mu^2 \cdot x + [-\mu^2 \cdot e_0] \cdot \sin\left(\frac{\pi \cdot x}{L}\right)$$

The coefficients $a_1$ to $a_6$ are constants that are defined by equating the coefficients of like terms. For example, the following is obtained when the terms in $x^4$ are equated:

$$a_1 \cdot \mu^2 = \left[-\frac{w \cdot \mu^2}{24 \cdot EI}\right],$$

therefore $$a_1 = \left[-\frac{w}{24 \cdot EI}\right]$$

by inspection.

The remaining coefficients $a_1$ to $a_6$ are obtained by the same method as defined in equations 6, 7, 8, 9, 10 and 11 respectively as follows:

$$a_1 = \left[-\frac{w}{24 \cdot EI}\right]$$

$$a_2 = \left[\frac{w \cdot L}{12 \cdot EI} - \left(\frac{M_a - M_b}{6 \cdot L \cdot EI}\right)\right]$$

$$a_3 = \left[\frac{M_a}{2 \cdot EI} + \frac{w}{2 \cdot \mu^2 \cdot EI}\right]$$

$$a_4 = \left\{\left[-\frac{w \cdot L^3}{24 \cdot EI} - \frac{M_a \cdot L}{2 \cdot EI} + \frac{(M_a - M_b) \cdot L}{6 \cdot EI}\right] - \frac{w \cdot L}{2 \cdot \mu^2 \cdot EI} + \left(\frac{M_a - M_b}{\mu^2 \cdot L \cdot EI}\right)\right\}$$

$$a_5 = -\left(\frac{1}{\mu^2}\right) \cdot \left[\frac{M_a}{EI} + \frac{w}{\mu^2 \cdot EI}\right]$$

$$a_6 = \frac{-\mu^2 \cdot e_0}{\left[\mu^2 - \frac{\pi^2}{L^2}\right]}$$

Coefficient A is then obtained by applying a first boundary condition as follows:

$$At\, x = L, y = 0$$

This results in equation 13 as follows:

$$A = \left\{\frac{a_5 \cdot \cos(\mu L) - a_1 \cdot L^4 - a_2 \cdot L^3 - a_3 \cdot L^2 - a_4 \cdot L - a_5}{\sin(\mu L)}\right\}$$

Coefficient B is then obtained by applying a second boundary condition as follows:

$$At\, x = 0, y = 0$$

This results in equation 13 as follows:

$$B = -a_5$$

The total displacement is defined as before as follows:

$$y_{total}(x) = y(x) + y_{pres}(x) + y_{applied\_couple}(x) + y_{build}(x)$$

Obtaining the Bending Moment and Maximum Strain:
The total displacement as defined above is as follows:

$$y_{total}(x) = y(x) + y_{pres}(x) + y_{applied\, couple}(x) + y_{build}(x)$$

Combining this with the second derivative of equation 1 provides a definition of the curvature of the beam at any point x as follows:

$$-EI\frac{d^2 y_{total}}{dx^2} = -P \cdot y_{total} + M_{0pres} + M_{0applied\_coule} + M_{0build} \quad \text{Equation 1}$$

However, the build defect $y_{build}(x)$ is not considered to contribute to the bending moment in a way that strains the beam when zero end loads are applied and so $M_{0build}$ is subtracted from equation 1. It should be noted that the effect of $e_0$ upon the overall bending moment (i.e. the effect of applying an end load to a beam that contains an initial deformation $e_0$) is preserved within $y_{total}(x)$ as part of the general solution, $y(x)$ (within the $a_6$ coefficient defined by Equation 11) and the initial displacement $y_{build}(x)$. By modifying equation 1 to account for only the components that strain the beam at zero end load, it is possible to obtain the moment M(x) at any point x along the beam as defined in equation 13 as follows:

$$M(x) = -EI \cdot \frac{d^2 y_{total}^{no\_build}}{dx^2} = -EI \cdot \frac{d^2 y_{total}}{dx^2} - M_{0build}$$

Where EI is the total EI of the cross section of the super-stringer and the middle term of equation 13 is defined in equation 14 as follows:

$$\frac{d^2 y_{total}^{no\_build}}{dx^2} = -A \cdot \mu^2 \cdot \sin(\mu x) \Big|$$

$$a_5 \cdot \mu^2 \cdot \cos(\mu x) \Big| 12 \cdot a_1 \cdot x^2 \Big| 6 \cdot a_2 \cdot x \Big| 2 \cdot a_3 \, a_6 \cdot \left(\frac{\pi^2}{L^2}\right) \cdot \sin\left(\frac{\pi \cdot x}{L}\right) +$$

$$\frac{w \cdot x^2}{2 \cdot EI} - \frac{w \cdot L \cdot x}{2 \cdot EI} - \frac{M_a}{EI} + \left(\frac{M_a - M_b}{L \cdot EI}\right) \cdot x$$

Equation 13 is used to determine the magnitude and position of the maximum moment along the beam, $M_{max}$, for the loading conditions specified.

The maximum material strain in the bending beam will occur at the extreme position and comprises a bending strain defined for the maximum moment obtained, which is calculated using Engineer's theory of bending, and a membrane strain, which is from the application of the direct load. This is defined in equation 15 as follows:

$$\varepsilon_{max} = \frac{P}{EA} - \frac{y_{top} \cdot M_{max}}{EI}$$

Where EA is the total elastic area and EI is the elastic bending inertia of the cross section of the super stringer and $y_{top}$ is the distance from the centroid 504 of the super stringer cross section to the extreme position, as shown in FIG. 5. Note that the positive y direction for the extreme location is towards the stiffener blade 503. Once the maximum material strain is known, it can then be compared to the allowable strain of the stiffener web or skin as described above.

The invention claimed is:
1. A computerized method for determining the strain induced at a selected point in a stiffened panel structure in response to a load, taking into account one or more out of plane (OOP) effects, said computerized method comprising the steps of:
defining a model of a stiffened panel structure;
determining using a processor an analysis point in said stiffened panel structure;
selecting an input load for said stiffened panel;
inputting data defining an out of plane (OOP) effect;
modelling a plurality of said stiffened panel structures as a continuous beam and calculating the boundary conditions of a selected one of said stiffened panel structures within said continuous beam model in response to said input load and taking into account said OOP effect;
modelling a single stiffened panel structure as a local beam model;
calculating using the processor the strain at said analysis point in said local beam model taking into account said boundary conditions calculated from said continuous beam model and further taking into account said OOP effect;
determining the load at which said calculated strain meets a strain allowable; and,
calculating a reserve factor (RF) in respect of said analysis point as the ratio of said determined load to said input load.

2. A method according to claim 1 comprising the further steps of:
determining data representing said strain allowable for said analysis point;
comparing said calculated strain to said strain allowable; and
outputting data representing whether or not said calculated strain meets said strain allowable within a predetermined tolerance.

3. A method according to claim 2 comprising the further steps of:
if said calculated strain does not meet said strain allowable within said predetermined tolerance then modifying the geometry of said stiffened panel accordingly; and
recalculating said strain at said analysis point.

4. A method according to claim 2 in which said strain allowable is determined in dependence on the geometry of said stiffened panel structure.

5. A method according to claim 2 in which said strain allowable is defined in relation to respective performance criterion.

6. A method according to claim 3 in which said strain allowable is recalculated for said selected analysis point in response to said modifying of said geometry of said stiffened panel structure.

7. A method according to claim 3 in which said stiffened panel structure comprises a panel element and a stiffener element and said modifying step comprises modifying a dimension of said panel element.

8. A method according to claim 1 in which said continuous beam boundary conditions comprise the boundary loads, moments and rotations for the selected stiffened panel structure within said continuous beam model.

9. A method according to claim 1 in which said strain is calculated from the internal pressures, loads and moments within said local beam model comprising said local beam model.

10. A method according to claim 1 in which said OOP effect comprises an effect that deflects said stiffened panel structure in its designed plane.

11. A method according to claim 1 in which said OOP effect is modelled as a predetermined displacement of said stiffened panel structure from its designed plane.

12. A method according to claim 1 in which a plurality of OOP effects are taken into account in calculating said strain.

13. A method according to claim 1 in which the direction in which said OOP effect acts on said stiffened panel structure is indeterminate and said calculation of said strain is performed for each said directions.

14. A method according to claim 13 in which, where a plurality of calculations are performed, the calculation exhibiting the highest strain is selected as the solution.

15. A method according to claim 1 in which said calculation of said strain is performed for said selected one of said stiffened panel structures within said continuous beam model and repeated in an adjacent stiffened panel structure in said continuous beam model.

16. A method according to claim 1 in which said stiffened panel structure comprises a panel element in the form of a wing cover panel for and aircraft wing and a stiffener element in the form of a stringer for an aircraft wing.

17. A group of one or more machine executable programs, stored on a non-transitory computer readable storage medium, arranged to enable a group of one or more programmable devices to perform the method of claim 1.

18. An apparatus comprising a processor; a non-transitory computer-readable medium containing computer-executable instructions that when executed by a processor to performs the following steps, comprising;
define a model of a stiffened panel structure;
determine an analysis point in said stiffened panel structure;
select an input load for said stiffened panel;
input data defining an out of plane (OOP) effect;
model a plurality of said stiffened panel structures as a continuous beam and calculate the boundary conditions of a selected one of said stiffened panel structures within said continuous beam model in response to said input load and taking into account said OOP effect;
model a single stiffened panel structure as local beam model;
calculate the strain at said analysis point in said local beam model taking into account said boundary conditions calculated from said continuous beam model and further taking into account said OOP effect;
determine the load at which said calculated strain meets a strain allowable; and,
calculate a reserve factor (RF) in respect of said analysis point as the ratio of said determined load to said input load.

19. Apparatus according to claim 18 being further operable to:
determine data representing said strain allowable for said analysis point;
compare said calculated strain to said strain allowable; and
output data representing whether or not said calculated strain meets said strain allowable within a predetermined tolerance.

20. Apparatus according to claim 19 being further operable to:
if said calculated strain does not meet said strain allowable within said predetermined tolerance then modify the geometry of said stiffened panel accordingly; and
recalculate said strain at said analysis point.

21. Apparatus according to claim 19 in which said strain allowable is determined in dependence on the geometry of said stiffened panel structure.

22. Apparatus according to claim 20 in which said strain allowable is recalculated for said selected analysis point in response to said modifying of said geometry of said stiffened panel structure.

23. Apparatus according to claim 20 in which said stiffened panel structure comprises a panel element and a stiffener element and said modifying step comprises modifying a dimension of said panel element.

24. Apparatus according to claim 19 in which said strain allowable is defined in relation to respective performance criterion.

25. Apparatus according to claim 18 in which said continuous beam boundary conditions comprise the boundary loads, moments and rotations for the selected stiffened panel structure within said continuous beam model.

26. Apparatus according to claim 18 in which said strain is calculated from the internal pressures, loads and moments within said local beam model comprising said local beam model.

27. Apparatus according to claim 18 in which said OOP effect comprises an effect that deflects said stiffened panel structure its designed plane.

28. Apparatus according to claim 18 in which said OOP effect is modelled as a predetermined displacement of said stiffened panel structure from its designed plane.

29. Apparatus according to claim 18 in which a plurality of OOP effects are taken into account in calculating said strain.

30. Apparatus according to claim 18 in which the direction in which said OOP effect acts on said stiffened panel structure is indeterminate and said calculation of said strain is performed for each said directions.

31. Apparatus according to claim 30 in which, where a plurality of calculations are performed, the calculation exhibiting the highest strain is selected as the solution.

32. Apparatus according to claim 18 in which said calculation of said strain is performed for said selected one of said stiffened panel structures within said continuous beam model and repeated an adjacent stiffened panel structure in said continuous beam model.

33. Apparatus according to claim 18 in which said stiffened panel structure comprises a panel element in the form of a wing cover panel for and aircraft wing and a stiffener element in the form of a stringer for an aircraft wing.

* * * * *